United States Patent [19]

Kashimura

[11] Patent Number: 5,083,048

[45] Date of Patent: Jan. 21, 1992

[54] BIMOS TRI-STATE OUTPUT BUFFER

[75] Inventor: Masahiko Kashimura, Tokyo, Japan

[73] Assignee: NEC Corporation, Japan

[21] Appl. No.: 480,108

[22] Filed: Feb. 14, 1990

[30] Foreign Application Priority Data

Feb. 14, 1989 [JP] Japan .................... 1-34811

[51] Int. Cl.$^5$ ................ H03K 19/094; H03K 19/017;
H03K 19/20; H03K 19/003
[52] U.S. Cl. ........................ 307/473; 307/446;
307/451; 307/475
[58] Field of Search ............. 307/443, 473, 270, 446,
307/570, 475, 450, 451, 452, 453, 279

[56] References Cited

U.S. PATENT DOCUMENTS

| 4,280,065 | 7/1981 | Minato et al. ............... 307/473 |
| 4,703,203 | 10/1987 | Gallup et al. ............... 307/473 X |
| 4,733,110 | 3/1988 | Hara et al. ................. 307/446 |
| 4,804,869 | 2/1989 | Masuda et al. .............. 307/446 |
| 4,963,766 | 10/1990 | Lungberg .................... 307/568 X |

Primary Examiner—Stanley D. Miller
Assistant Examiner—David R. Bertelson
Attorney, Agent, or Firm—Laff, Whitesel, Conte & Saret

[57] ABSTRACT

A tri-state output buffer has a signal input terminal, a control terminal and a signal ouput terminal and is controlled by a control signal applied to the control terminal so as to be selectively put in an inactive condition maintaining the signal output terminal in a high impedance condition and in an active condition bringing the signal output terminal either into a high level or into a low level in response to a signal applied to the signal input terminal. The tri-state output buffer comprises a pre-buffer circuit having an input node connected to the signal input terminal, and an output node, and controlled by the control signal applied to the control terminal so as to selectively bring the output node into a high impedance condition or into an active condition assuming either a high level or a low level in response to the signal applied to the signal input terminal. A bipolar transistor is connected between a power supply voltage and a ground and has a base connected to the output node of the pre-buffer circuit and an emitter connected to the signal output terminal of the tri-state output buffer. A first switching element is connected between the ground and the signal output terminal of the tri-state output buffer and is controlled by the control signal applied to the control terminal so as to be selectively turned on and off. A second switching element is connected between the base of the bipolar transistor and the signal output terminal of the tri-state output buffer and is controlled by the control signal applied to the control terminal so as to be selectively turned on and off.

8 Claims, 3 Drawing Sheets

BIMOS TRI-STATE OUTPUT BUFFER

BACKGROUND OF THE INVENTION

1. Field of the Invention

The present invention relates to a tri-state output buffer using a bipolar transistor and MOS transistors (MOSFETs).

2. Description of Related Art

One typical type of conventional tri-state output buffers using a bipolar transistor and MOS transistors is composed of an output NPN transistor having a collector connected to a high voltage of a power supply and an emitter connected to an output line. A base of the NPN transistor is grounded through an input or first MOS transistor having a gate connected to receive an input signal. A second MOS transistor is connected in parallel to the first MOS transistor and a gate of the second MOS transistor is connected to receive a high impedance control signal. In addition, the emitter of the NPN transistor is also connected to the ground through a third MOS transistor having a gate connected to receive the high impedance control signal. Accordingly, the NPN transistor and the third MOS transistor are connected in series between the high voltage of the power supply and the ground.

In the above mentioned construction, when the output of the conventional tri-state output buffer should be brought into a high impedance condition, the second and third MOS transistors are respectively rendered on and off by the high impedance control signal, so that both of the NPN transistor and the third MOS transistor connected in series with the NPN transistor are turned off.

In this condition, if the output line is supplied with a high level signal from another output buffer connected to the same output line, an base-emitter of the NPN transistor is put in a revere biased condition, since the base of the NPN transistor is grounded by the turned-on second MOS transistor and the emitter of the NPN transistor is maintained in a floating condition by the turned-off third MOS transistor.

Here, it should be noted that a base-emitter junction of currently used NPN bipolar transistors has a reverse biased withstand voltage of about 4 V to 4.5 V, and this reverse biased withstand voltage is apt to further decrease with increase in fineness or miniaturization of transistors. On the other hand, the conventional BiMOS tri-state output buffer is often incorporated in a 5-V power supply system which is one of currently widely used standard systems. Therefore, when the base-emitter junction of the NPN transistor of the BiMOS tri-state output buffer is subjected to a high level signal which is higher than the reverse biased withstand voltage and which is supplied from another output buffer, the base-emitter junction of the NPN transistor of the BiMOS tri-state output buffer is broken down, so that a breakdown current flows from the emitter to the base of the NPN transistor of the BiMOS tri-state output buffer.

SUMMARY OF THE INVENTION

Accordingly, it is an object of the present invention to provide a BiMOS tri-state output buffer which has overcome the above mentioned defect of the conventional one.

Another object of the present invention is to provide a BiMOS tri-state output buffer in which even if a high level signal is applied to an emitter of an output bipolar transistor of the BiMOS tri-state output buffer, an base-emitter junction of the output bipolar transistor is never broken down, so that the BiMOS tri-state output buffer is not interfered by the high level signal from another output buffer.

The above and other objects of the present invention are achieved in accordance with the present invention by a tri-state output buffer which has a signal input terminal, a control terminal and a signal output terminal and is controlled by a control signal applied to the control terminal so as to be selectively put in an inactive condition maintaining the signal output terminal in a high impedance condition and in an active condition bringing the signal output terminal either into a high level or into a low level in response to a signal applied to the signal input terminal. The tri-state output buffer comprises a pre-buffer circuit having an input node connected to the signal input terminal, and an output node, and controlled by the control signal applied to the control terminal so as to selectively bring the output node into a high impedance condition or into an active condition assuming either a high level or a low level in response to the signal applied to the signal input terminal. A bipolar transistor is connected between a power supply voltage and a ground and has a base connected to the output node of the pre-buffer circuit and an emitter connected to the signal output terminal of the tri-state output buffer. A first switching element is connected between the ground and the signal output terminal of the tri-state output buffer and is controlled by the control signal applied to the control terminal so as to be selectively turned on and off. A second switching element is connected between the base of the bipolar transistor and the signal output terminal of the tri-state output buffer and is controlled by the control signal applied to the control terminal so as to be selectively turned on and off.

As seen from the above, the tri-state output buffer in accordance with the present invention is characterized in that the second switching element is connected between the base of the output bipolar transistor and the signal output of the tri-state output buffer. When the tri-state output buffer is put in a high impedance condition, the base of the output bipolar transistor is brought into a high impedance condition by action of the pre-buffer circuit under control of the control signal, and on the other hand, the base and the emitter (i.e., the signal output of the tri-state output buffer) of the bipolar transistor are short-circuited to each other by turning on the second switching element under control of the control signal. Therefore, even if the signal output of the tri-state output buffer is supplied with a high level signal from another output buffer, a voltage applied across the base-emitter junction of the output bipolar transistor is restrained to a level smaller than a breakdown voltage of the base-emitter junction of the output bipolar transistor. In other words, the tri-state output buffer in accordance with the present invention is not interfered with a high level signal outputted from another output buffer.

The above and other objects, features and advantages of the present invention will be apparent from the following description of preferred embodiments of the invention with reference to the accompanying drawings.

DESCRIPTION OF THE PREFERRED EMBODIMENTS

Figure 1:
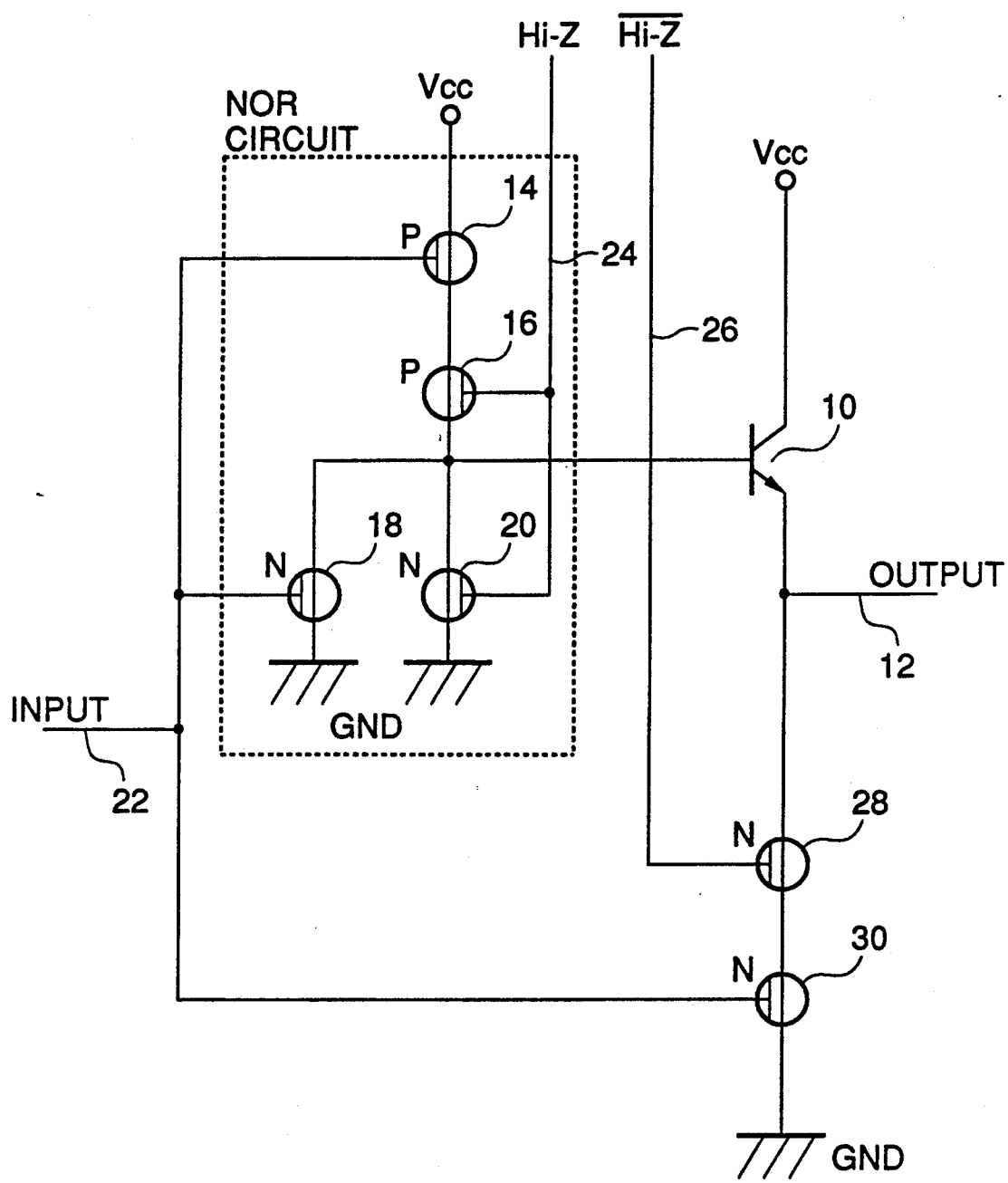
FIG. 1 is a circuit diagram of a conventional tri-state output buffer using a bipolar transistor and MOS transistors.

Referring to FIG. 1, there is shown a circuit diagram of a conventional tri-state output buffer using a bipolar transistor and MOS transistors.

The shown circuit includes an NPN bipolar transistor 10 having a collector connected to a positive voltage Vcc of an electric voltage supply and an emitter connected to an output line 12. A base of the transistor 10 is connected through to a pair of series-connected P-channel MOSFETs 14 and 16 to the positive voltage Vcc, and through a pair of parallel-connected N-channel MOSFETs 18 and 20 to ground GND. A gate of one of the series-connected P-channel MOSFETs 14 and a gate of one of the parallel-connected N-channel MOSFETs 18 are connected commonly to an input line 22. A gate of the other of the series-connected P-channel MOSFETs 16 and a gate of the other of the parallel-connected N-channel MOSFETs 20 are connected commonly to a line 24 so as to receive a high impedance control signal Hi-Z. In the above mentioned arrangement, the series-connected P-channel MOSFETs 14 and 16 and the parallel-connected N-channel MOSFETs 18 and 20 form a NOR circuit having the lines 22 and 24 as two inputs, an output being formed by a connection node between the MOSFETs 16 and 18 and 20 and being connected to the base of the bipolar transistor 10.

In addition, the emitter of the bipolar transistor 10 is connected to the ground GND through another pair of series-connected N-channel MOSFETs 28 and 30. A gate of one of the series-connected N-channel MOSFETs 30 is connected to the input line 22, and a gate of the other of the series-connected N-channel MOSFETs 28 is connected to a line 26 so as to receive a high impedance control signal Hi-Z complementary to the high impedance control signal $\overline{Hi-Z}$.

With the above mentioned arrangement, when the high impedance control signals Hi-Z and $\overline{Hi-Z}$ are set to a low level L and a high level H, respectively, the P-channel transistor 16 is turned on and the N-channel transistor 20 is turned off. Therefore, the NOR circuit function as an inverter, so that a signal applied to the input line 22 is inverted and the inverted input signal is applied to the base of the bipolar transistor 10. Accordingly, when the signal applied to the input line 22 is at a low level, a high level signal is applied to the base of the bipolar transistor 10, so that the bipolar transistor 10 is turned on. When the signal applied to the input line 22 is at a high level, a low level signal is applied to the base of the bipolar transistor 10, so that the bipolar transistor 10 is turned off. On the other hand, since the N-channel transistor 28 receiving at the gate thereof the high level of the high impedance control signal $\overline{Hi-Z}$ is in an on condition, the N-channel transistor 30 receiving an input signal 22 at the gate thereof is in a condition in which the drain of the N-channel transistor 30 is connected substantially directly to the output line 12. When the input signal 22 is at the low level, the N-channel transistor 30 is turned off, and when the input signal 22 is at the high level, the N-channel transistor 30 is turned on.

Accordingly, dependently upon whether the signal applied to the input line 22 is at the high level or at the low level, one of the NPN bipolar transistor 10 and the N-channel transistor 30 is turned on and the other is turned off so as to drive a load connected to the output line 12, so that either the high level signal or the low level signal is outputted through the output line 12 to another circuit.

When the high impedance control signals Hi-Z and $\overline{Hi-Z}$ are set to a high level H and a low level L, respectively, since one of the inputs of the NOR circuit is fixed to the high level, the output of the NOR circuit is fixed to the low level, which is supplied to the base of the NPN bipolar transistor 10. As a result, the NPN bipolar transistor 10 is rendered off. On the other hand, the N-channel transistor 28 receiving at the gate thereof the low level of the high impedance control signal $\overline{Hi-Z}$ is in an off condition. Accordingly, the output line 12 is in a high impedance condition in relation to both of the voltage Vcc of the voltage supply and the ground GND.

If the output of the shown BiMOS tri-state output buffer is in the high impedance condition, the output line 12 can be driven by another output buffer connected to the output line 12.

In the above mentioned conventional BiMOS tri-state output buffer, when the output of the BiMOS tri-state output buffer is in a high impedance condition, if another output buffer connected to the output line 12 outputs a high level signal, a reversed biased voltage in proximity to the voltage supply voltage Vcc is applied across a base-emitter junction of the NPN bipolar transistor 10. Here, a base-emitter junction of currently used NPN bipolar transistors has a reverse biased withstand voltage of about 4 V to 4.5 V, and this reverse biased withstand voltage is apt to further decrease with increase in fineness or miniaturization of transistors. Specifically, it is an ordinary practice that if a base width of bipolar transistors is reduced, an impurity concentration of a base region is increased in order to prevent expansion of a depletion layer in a base-collector junction and in a base-emitter junction. In this case, it is also an ordinary practice to further increase an impurity concentration of an emitter region in order to prevent decrease in an injection efficiency of carriers to the base region. As a result, the impurity concentration in the base-emitter junction inevitably increases, and therefore, the reverse biased withstand voltage will drop.

Therefore, if the conventional BiMOS tri-state output buffer is incorporated in a 5-V power supply system which is one of currently widely used standard systems, and if the system incorporating therein the conventional BiMOS tri-state output buffer is assembled in the form of an integrated circuit with a high degree of fineness or integration density, when the base-emitter junction of the NPN transistor of the BiMOS tri-state output buffer used in the system is subjected to a high level signal which is higher than the reverse biased withstand voltage and which is supplied from another integrated circuit, the base-emitter junction of the NPN transistor of the BiMOS tri-state output buffer is broken down, so that a breakdown current flows from the emitter to the base of the NPN transistor of the BiMOS tri-state output buffer. In other words, it has to be designed that an high level signal outputted from an output buffer of another integrated circuit never exceeds over the reverse biased withstand voltage of the base-emitter junction of the NPN transistor of the conventional BiMOS tri-state output buffer. Otherwise, a waste breakdown current will flows.

Figure 2:
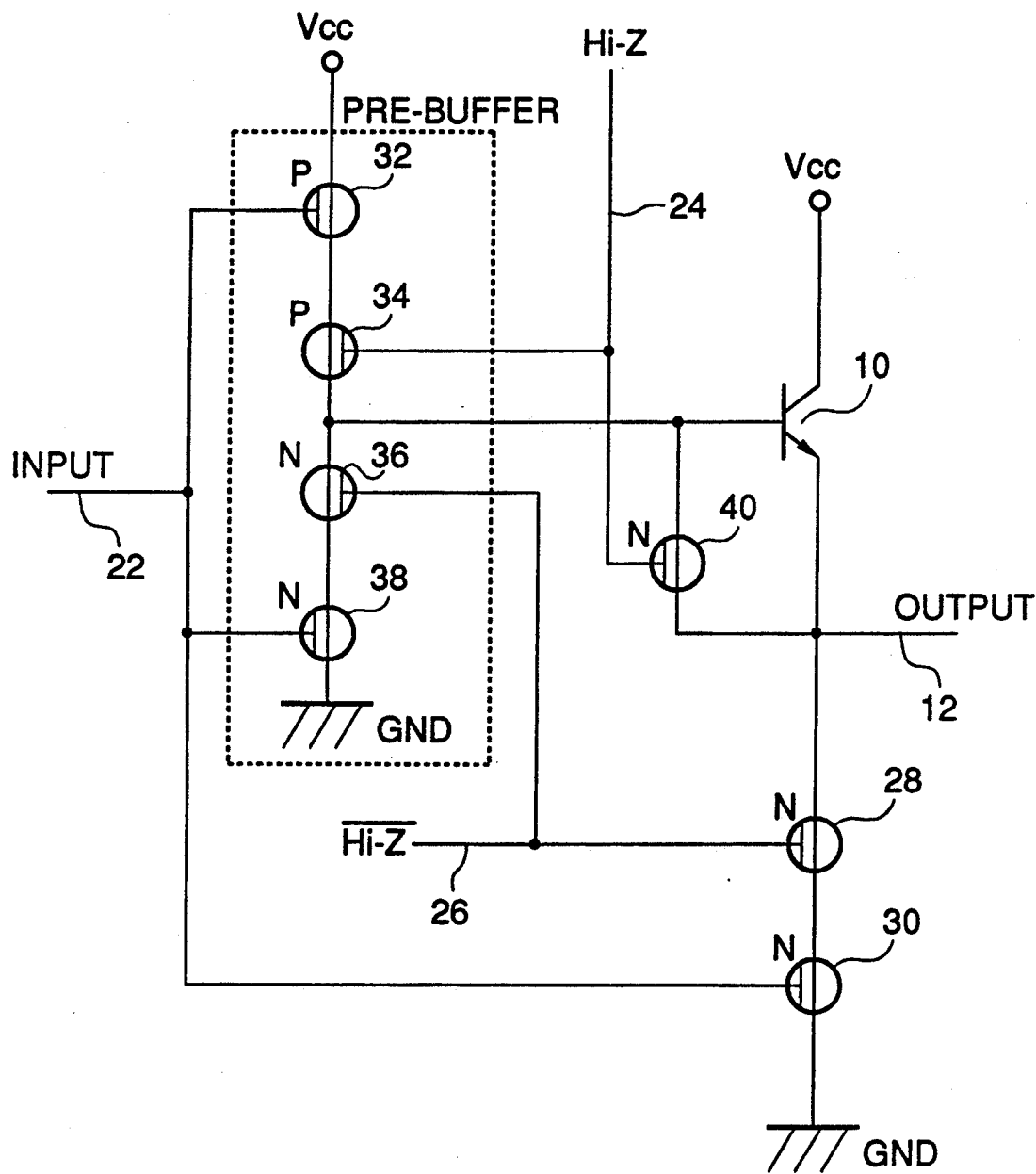
FIG. 2 is a circuit diagram of a first embodiment of the tri-state output buffer in accordance with the present invention.

Turning to FIG. 2, there is shown a circuit diagram of a first embodiment of the tri-state output buffer in accordance with the present invention. In FIG. 2, elements similar or corresponding to those shown in FIG. 1 are given the same Reference Numerals, and explanation thereof will be omitted for simplification of the explanation.

As seen from comparison between FIGS. 1 and 2, the tri-state buffer shown in FIG. 2 has a pre-buffer circuit composed of MOS transistors (MOSFETs), in place of the NOR circuit shown in FIG. 1. The pre-buffer circuit includes a pair of P-channel MOS field effect transistors 32 and 34 series-connected between the positive voltage Vcc of the electric voltage supply and the base of the NPN bipolar transistor 10, and a pair of N-channel MOS field effect transistors 36 and 38 series-connected between the ground and the base of the NPN bipolar transistor 10. Bases of the P-channel MOSFET 32 and the N-channel MOSFET 38 are connected commonly to the input line 22. A base of the P-channel MOSFET 34 is connected to the line 24 so as to receive the high impedance control signal Hi-Z and a base of the N-channel MOSFET 36 is connected to the line 26 so as to receive the complementary high impedance control signal $\overline{\text{Hi-Z}}$. This complementary high impedance control signal $\overline{\text{Hi-Z}}$ is also supplied to the gate of the N-channel MOSFET 28 which forms a first switching element. In addition, another N-channel MOSFET 40 is connected between the base and the emitter (the output line 12) of the NPN bipolar transistor 10. A gate of this N-channel MOSFET 40 is connected to receive the high impedance control signal Hi-Z. The N-channel MOSFET 40 forms a second switching element.

The tri-state output buffer shown in FIG. 2 operates as follows:

When the high impedance control signal Hi-Z and the complementary high impedance control signal $\overline{\text{Hi-Z}}$ are set to the low level L and the high level H, respectively, the P-channel MOSFET 34 and the N-channel MOSFET 36 are turned on, respectively. Therefore, the pre-buffer circuit composed of the P-channel MOSFETs 32 and 34 and the N-channel MOSFETs 36 and 38 functions as an inverter. On the other hand, the N-channel MOSFET 40 is maintained off. As a result, the tri-state output buffer shown in FIG. 2 operates similarly to the buffer shown in FIG. 1 when the high impedance control signal Hi-Z and complementary high impedance control signal $\overline{\text{Hi-Z}}$ are set to the low level L and the high level H, respectively. Accordingly, dependently upon whether the signal applied to the input line 22 is at the high level or at the low level, one of the NPN bipolar transistor 10 and the N-channel transistor 30 is turned on and the other is turned off so as to drive a load connected to the output line 12, so that either the high level signal or the low level signal is outputted through the output line 12 to another circuit.

On the other hand, when the high impedance control signal Hi-Z and the complementary high impedance control signal $\overline{\text{Hi-Z}}$ are set to the high level H and the low level L, respectively, the P-channel MOSFET 34 and the N-channel MOSFET 36 are turned off, respectively. Namely, the output of the pre-buffer circuit is brought into a high impedance condition. In addition, the N-channel MOSFET 28 receiving at the gate thereof the low level of complementary high impedance control signal $\overline{\text{Hi-Z}}$ is turned off. A high impedance is established between the output line 12 and the ground. On the other hand, the N-channel MOSFET 40 receiving at the gate thereof the high level of high impedance control signal Hi-Z is turned on, so that the base and the emitter of the NPN bipolar transistor 10 are short-circuited. Therefore, the NPN bipolar transistor 10 is fixed in a cut-off region, so that A high impedance is established between the output line 12 and the positive voltage Vcc.

Here, it should be noted that since the base and the emitter of the NPN bipolar transistor 10 are short-circuited by the turned-on N-channel MOSFET 40, a signal applied through the output line 12 from another output buffer is commonly applied to the base and the emitter of the NPN bipolar transistor 10. Therefore, although a potential difference corresponding to a threshold $V_T$ of the N-channel MOSFET 40 appears between the base and the emitter of the NPN bipolar transistor 10, a voltage exceeding a reverse biased voltage of the base-emitter junction of the NPN bipolar transistor 10 will never applied between the base and the emitter of the NPN bipolar transistor 10. Accordingly, the tri-state output buffer shown in FIG. 2 will not interfere with a high level signal outputted onto the output line 12 from another output buffer. On the other hand, it is possible to prevent a breakdown current which would occur when the high level signal outputted onto the output line 12 from another output buffer exceeds the reverse biased voltage of the base-emitter junction of the NPN bipolar transistor 10.

Figure 3:
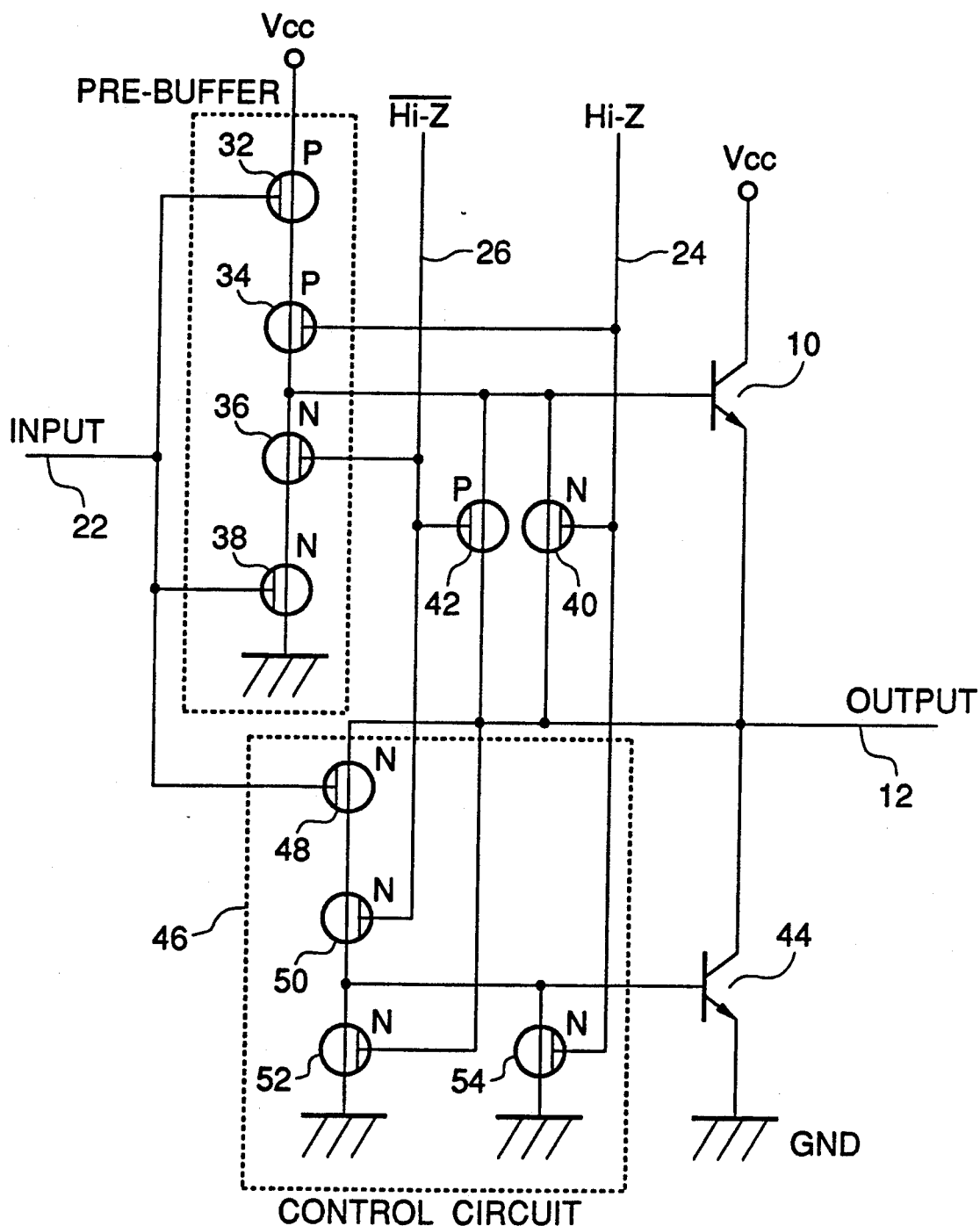
FIG. 3 is a circuit diagram of a second embodiment of the tri-state output buffer in accordance with the present invention.

Referring to FIG. 3, there is shown a circuit diagram of a second embodiment of the tri-state output buffer in accordance with the present invention. In FIG. 3, elements similar or corresponding to those shown in FIG. 2 are given the same Reference Numerals, and explanation thereof will be omitted for simplification of the explanation.

As seen from comparison between FIGS. 2 and 3, the tri-state buffer shown in FIG. 3 has a P-channel MOSFET 42 which is connected in parallel to the N-channel MOSFET 40 and which has a gate connected to the line 26 to receive the complementary high impedance control signal $\overline{\text{Hi-Z}}$. In place of the N-channel MOSFETs 28 and 30, a second NPN bipolar transistor 44 is provided as the first switching element connected between the ground GND and the output line 12. In order to control the on-off of the NPN bipolar transistor 44, a control circuit 46 is connected to a base of the NPN bipolar transistor 44.

Specifically, the control circuit 44 includes a pair of N-channel MOSFETs 48 and 50 series-connected between the output line 12 and the base of the bipolar transistor 44. One of the series-connected N-channel MOSFETs 48 is connected at a gate thereof to the input signal line 22, and the other of the series-connected N-channel MOSFETs 50 is connected at a gate thereof to the line 26 so as to receive the complementary high impedance control signal $\overline{\text{Hi-Z}}$. Another pair of N-channel MOSFETs 52 and 54 are parallel-connected between the ground and the base of the bipolar transistor 44. One of the parallel-connected N-channel MOSFETs 52 is connected at a gate thereof to the output signal line 12, and the other of the parallel-connected N-channel MOSFETs 50 is connected at a gate thereof to the line 24 so as to receive the high impedance control signal Hi-Z.

The tri-state output buffer shown in FIG. 3 operates as follows:

When the high impedance control signal Hi-Z and the complementary high impedance control signal $\overline{\text{Hi-Z}}$ are set to the low level L and the high level H, respectively, the pre-buffer circuit composed of the P-channel MOSFETs 32 and 34 and the N-channel MOSFETs 36 and 38 functions as an inverter, similarly to the first embodiment shown in FIG. 2. On the other hand, the N-channel MOSFET 40 receiving at the gate thereof the low level of high impedance control signal Hi-Z and the P-channel MOSFET 42 receiving at the gate thereof the high level of complementary high impedance control signal $\overline{\text{Hi-Z}}$ are off. In addition, the N-channel MOSFET 54 receiving at the gate thereof the low level of high impedance control signal Hi-Z is turned off and the N-channel MOSFET 50 receiving at the gate thereof the high level of complementary high impedance control signal $\overline{\text{Hi-Z}}$ is turned on. Therefore, the conduction control of the bipolar transistor 10 is performed in the same manner as that in the first embodiment.

Furthermore, when the signal applied to the input line 22 is at a high level, the N-channel MOSFET 48 is turned on, and therefore, the output signal of the tri-state output buffer is applied to the base of the bipolar transistor 44 through the turned-on MOSFETs 48 and 50. As a result, the bipolar transistor 44 is turned on, so that the output line 12 is brought to a low level. On the other hand, when the signal applied to the input line 22 is at a low level, the N-channel transistor 52 is turned on so as that a ground potential is applied to the base of the bipolar transistor 44. Accordingly, the bipolar transistor 44 is turned off.

Thus, when the signal applied to the input line 22 is at a high level, the bipolar transistor 10 is turned off, and when the signal applied to the input line 22 is at a high level, the bipolar transistor 10 is turned on. Therefore, the bipolar transistors 10 and 44 are turned on and off in a complementary relation in which when one of bipolar transistors 10 and 44 are turned on the other is turned off and vice versa. As a result, the high level signal and the low level signal are alternatively outputted onto the output line 12.

On the other hand, when the high impedance control signal Hi-Z and the complementary high impedance control signal $\overline{\text{Hi-Z}}$ are set to the high level H and the low level L, respectively, the N-channel MOSFET 54 is turned on, so that the ground potential is applied to the base of the bipolar transistor 44. Therefore, the bipolar transistor 44 is maintained in an off condition. In addition, the N-channel MOSFET 40 receiving at the gate thereof the high level of high impedance control signal Hi-Z and the P-channel MOSFET 42 receiving at the gate thereof the low level of complementary high impedance control signal $\overline{\text{Hi-Z}}$ are turned on, respectively, so that the base and emitter of the bipolar transistor 10 are short-circuited. Namely, the bipolar transistor 10 is locked in a cut-off region. Thus, both of the two bipolar transistors 10 and 44 are turned off, A high impedance condition is established on the output line 12.

In the second embodiment shown in FIG. 3, the second switching element for short-circuiting the base and the emitter of the NPN bipolar transistor 10 is composed of a parallel circuit consisting of the N-channel MOSFET 40 and the P-channel MOSFET 42. Therefore, a potential difference corresponding to the threshold $V_T$ of the N-channel MOSFET 40 will never occur between the base and the emitter of the NPN bipolar transistor 10. In other words, the voltage difference between the base and the emitter of the NPN bipolar transistor 10 can be further reduced in comparison with the first embodiment shown in FIG. 2, and the NPN bipolar transistor 10 can be surely locked in the cut-off region.

As seen from the above explanation, the tri-state output buffer in accordance with the present invention is characterized by provision of a switching element for short-circuiting and opening between a base and an emitter of an output bipolar transistor for supplying a electric supply voltage to an output line connected to the emitter of the same bipolar transistor. When the tri-state output buffer is put in a high impedance condition, the switching element is turned on so that the base and the emitter of the output bipolar transistor is short-circuited, with the result that a voltage applied between the base and the emitter of the output bipolar transistor will never exceed a reverse biased withstand voltage of a base-emitter junction of the output bipolar transistor. Therefore, even if a bipolar transistor having a relatively low reverse biased withstand voltage of a base-emitter junction, the base-emitter junction is never broken down. Namely, generation of a breakdown current is effectively suppressed. In addition, the tri-state output buffer will not interfere with a high level signal outputted from another output buffer connected to the same output line.

The invention has thus been shown and described with reference to the specific embodiments. However, it should be noted that the present invention is in no way limited to the details of the illustrated structures but changes and modifications may be made within the scope of the appended claims.

I claim:

1. A tri-state output buffer which has a signal input terminal, a control terminal and a signal output terminal and is controlled by a control signal applied to the control terminal so as to be selectively put in an inactive condition maintaining the signal output terminal in a high impedance condition and in an active condition bringing the signal output terminal either into a high level or into a low level in response to a signal applied to the signal input terminal, the tri-state output buffer comprising a pre-buffer circuit having an input node connected to the signal input terminal, and an output terminal node, and controlled by the control signal applied to the control terminal so as to selectively bring the output node into a high impedance condition or into an active condition assuming either a high level or a low level in response to the signal applied to the signal input terminal, a bipolar transistor connected between a power supply voltage and a ground and having a base connected to the output node of the pre-buffer circuit and an emitter connected to the signal output terminal of the tri-state output buffer, a first switching element connected between the ground and the signal output terminal of the tri-state output buffer and controlled by the control signal applied to the control terminal so as to be selectively turned on and off, and a second switching element connected between the base of the bipolar transistor and the signal output terminal of the tri-state output buffer and controlled by the control signal applied to the control terminal so as to be turned on when the signal output terminal is brought into the high impedance condition and turned off when the signal output terminal is brought into the active condition.

2. A tri-state output buffer claimed in claim 1 wherein the bipolar transistor is of an NPN type and has a collector connected to the power supply voltage and an emitter connected the signal output terminal and also through the first switching element to the ground, a base of the NPN bipolar transistor being connected to the output node of the pre-buffer circuit, and the second switching element is connected between the base and the emitter of the NPN bipolar transistor, and is turned on when the control signal applied to the control signal instructs to put the signal output terminal in the high impedance condition, so that the base and the emitter of the NPN bipolar transistor is short-circuited.

3. A tri-state output buffer which has a signal input terminal, a control terminal and a signal output terminal, a control signal including a first control signal and a second control signal complementary to the first control signal, the first control signal and a second control signal being brought to a high level and a low level, respectively, when the signal output terminal of the tri-state output buffer should be brought into a high impedance condition, said tri-state buffer being controlled by said control signal applied to the control terminal so as to selectively put said buffer into an inactive condition maintaining the signal output terminal in a high impedance condition and in an active condition bringing the signal output terminal either into a high level or into a low level in response to a signal applied to the signal input terminal, the tri-state output buffer comprising a pre-buffer circuit having an input node connected to the signal input terminal, and an output node, and controlled by the control signal applied to the control terminal so as to selectively bring the output node into a high impedance condition or into an active condition assuming either a high level or a low level in response to the signal applied to the signal input terminal, a bipolar transistor connected between a power supply voltage and a ground and having a base connected to the output node of the pre-buffer circuit and an emitter connected to the signal output terminal of the tri-state output buffer, a first switching element connected between the ground and the signal output terminal of the tri-state output buffer and controlled by the control signal applied to the control terminal so as to be selectively turned on and off, and a second switching element connected between the base of the bipolar transistor and the signal output terminal of the tri-state output buffer and controlled by the control signal applied to the control terminal so as to be selectively turned on and off, the second switching element comprising a first N-channel field effect transistor having a gate connected to receive the first control signal, and the first switching element comprising second and third N-channel field effect transistors series-connected between the emitter of the NPN bipolar transistor and the ground, a gate of the second N-channel field effect transistor being connected to the signal input terminal and the gate of the third N-channel field effect transistor being connected to receive the second control signal.

4. A tri-state output buffer claimed in claim 3 wherein the pre-buffer circuit includes a pair of P-channel field effect transistors series-connected between the power supply voltage and the output node of the pre-buffer circuit, one of the P-channel field effect transistors having a gate connected to the signal input terminal and the other of the P-channel field effect transistors having a gate connected to receive the first control signal, and a pair of N-channel field effect transistors series-connected between the ground and the output node of the pre-buffer circuit, one of the N-channel field effect transistors having a gate connected to the signal input terminal and the other of the N-channel field effect transistors having a gate connected to receive the second control signal.

5. A tri-state output buffer claimed in claim 2 wherein the control signal includes a first control signal and a second control signal complementary to the first control signal, the first control signal and a second control signal being brought to a high level and a low level, respectively, when the signal output terminal of the tri-state output buffer should be brought into a high impedance condition, and wherein the second switching element is composed of a first N-channel field effect transistor having a gate connected to receive the first control signal, a first P-channel field effect transistor connected in parallel to the first N-channel field effect transistor and having a gate connected to receive the second control signal, so that when the first control signal and the second control signal are set to a high level and a low level, respectively, in order to instruct that the signal output terminal of the tri-state output buffer should be brought into a high impedance condition, both of the first N-channel field effect transistor and the first P-channel field effect transistor are brought into an on condition.

6. A tri-state output buffer claimed in claim 5 wherein the first switching element is composed of a second NPN bipolar transistor having a collector connected to the signal output terminal and an emitter connected to the ground, a base of the second NPN bipolar transistor being connected to a control circuit which is connected to the signal input terminal and receives the first and second control signals, so that the second NPN bipolar transistor is turned on when the first named NPN bipolar transistor is turned off and vice versa.

7. A tri-state output buffer claimed in claim 6 wherein the control circuit includes second and third N-channel field effect transistors series-connected between the collector and the base of the second NPN bipolar transistor, a gate of the second N-channel field effect transistor being connected to the signal input terminal and the gate of the third N-channel field effect transistor being connected to receive the second control signal, and fourth and fifth N-channel field effect transistors parallel-connected between the base of the second NPN bipolar transistor and the ground, a gate of the fourth N-channel field effect transistor being connected to the signal output terminal and the gate of the fifth N-channel field effect transistor being connected to receive the first control signal.

8. A tri-state output buffer which has a signal input terminal, a control terminal and a signal output terminal and is controlled by a control signal applied to the control terminal so as to be selectively put into an inactive condition maintaining the signal output terminal in a high impedance condition and in an active condition bringing the signal output terminal either into a high level or into a low level in response to a signal applied to the signal input terminal, the tri-state output buffer comprising a pre-buffer circuit having an input node connected to the signal input terminal, and an output terminal node, and controlled by the control signal applied to the control terminal so as to selectively bring the output node into a high impedance condition or into an active condition assuming either a high level or a low level in response to the signal applied to the signal input terminal, the pre-buffer circuit including a pair of P-channel field effect transistors series-connected between the power supply voltage and the output node of the pre-buffer circuit, one of the P-channel field effect transistors having a gate connected to the signal input terminal and the other of the P-channel field effect transistors having a gate connected to receive the first control signal, and a pair of N-channel field effect transistors series-connected between the ground and the output terminal of the pre-buffer circuit, one of the N-channel field effect transistors having a gate connected to the signal input terminal and the other of the N-channel field effect transistors having a gate connected to receive the second control signal, a bipolar transistor connected between a power supply voltage and a ground and having a base connected to the output node of the pre-buffer circuit and an emitter connected to the signal output terminal of the tri-state output buffer, a first switching element connected between the ground and the signal output terminal of the tri-state output buffer and controlled by the control signal applied to the control terminal so as to be selectively turned on and off, and a second switching element connected between the base of the bipolar transistor and the signal output terminal of the tri-state output buffer and controlled by the control signal applied to the control terminal so as to be selectively turned on and off.

* * * * *